(12) United States Patent
Takemori et al.

(10) Patent No.: US 7,939,886 B2
(45) Date of Patent: May 10, 2011

(54) TRENCH GATE POWER SEMICONDUCTOR DEVICE

(75) Inventors: Toshiyuki Takemori, Hanno (JP); Yuji Watanabe, Hanno (JP); Fuminori Sasaoka, Hanno (JP); Kazushige Matsuyama, Hanno (JP); Kunihito Oshima, Hanno (JP); Masato Itoi, Hanno (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 331 days.

(21) Appl. No.: 12/094,312

(22) PCT Filed: Nov. 22, 2005

(86) PCT No.: PCT/JP2005/021490
§ 371 (c)(1),
(2), (4) Date: May 20, 2008

(87) PCT Pub. No.: WO2007/060716
PCT Pub. Date: May 31, 2007

(65) Prior Publication Data
US 2008/0315301 A1 Dec. 25, 2008

(51) Int. Cl.
H01L 29/76 (2006.01)
H01L 29/94 (2006.01)
H01L 31/062 (2006.01)
H01L 31/113 (2006.01)
H01L 31/119 (2006.01)

(52) U.S. Cl. ........ 257/331; 257/330; 257/365; 438/185; 438/585

(58) Field of Classification Search .................. 257/330, 257/331, 365, 382, E29.125, E29.257; 438/195, 438/585, 588
See application file for complete search history.

(56) References Cited

U.S. PATENT DOCUMENTS

| 5,689,128 | A | 11/1997 | Hshieh et al. |
| 6,118,150 | A | 9/2000 | Takahashi |
| 6,534,828 | B1 | 3/2003 | Kocon |
| 6,541,818 | B2 * | 4/2003 | Pfirsch et al. ............. 257/331 |

(Continued)

FOREIGN PATENT DOCUMENTS

EP 0652597 A1 5/1995

(Continued)

OTHER PUBLICATIONS

International Search Report issued Feb. 21, 2006 for PCT/JP2005/021490.

(Continued)

*Primary Examiner* — Phuc T Dang
(74) *Attorney, Agent, or Firm* — Lowe Hauptman Ham & Berner LLP

(57) ABSTRACT

A trench gate power MOSFET (1) includes: an n⁻-type epitaxial layer (12); a p-type body region (20) formed in the vicinity of an upper surface of the n⁻-type epitaxial layer (12); a plurality of trenches (14) formed so as to reach the n⁻-type epitaxial layer (12) from an upper surface of the p-type body region (20); and gates (18) formed in the trenches (14). In some regions facing the p-type body region (20) in the n⁻-type epitaxial layer (12), p-type carrier extracting regions (26a, 26b, 26c) are formed. According to the trench gate power MOSFET (1), holes generated in a cell region can be effectively collected through the p-type carrier extracting regions (26a, 26b, 26c) so as to further increase a speed of the switching operation.

12 Claims, 12 Drawing Sheets

U.S. PATENT DOCUMENTS

| | | | |
|---|---|---|---|
| 6,603,173 B1 | 8/2003 | Okabe et al. | |
| 6,888,196 B2 * | 5/2005 | Kobayashi | 257/330 |
| 2001/0048132 A1 | 12/2001 | Ito et al. | |
| 2004/0084722 A1 | 5/2004 | Yamaguchi et al. | |
| 2004/0178441 A1 * | 9/2004 | Yanagisawa | 257/327 |
| 2004/0195618 A1 | 10/2004 | Saito et al. | |
| 2004/0207009 A1 | 10/2004 | Yamaguchi et al. | |

FOREIGN PATENT DOCUMENTS

| | | |
|---|---|---|
| EP | 0889511 A2 | 1/1999 |
| JP | 8-167713 A | 6/1996 |
| JP | 09-270512 A | 10/1997 |
| JP | 11-501459 A | 2/1999 |
| JP | 2000-101073 A | 4/2000 |
| JP | 2002-164542 A | 6/2002 |
| JP | 2004-153112 A | 5/2004 |
| JP | 2004-311716 A | 11/2004 |

OTHER PUBLICATIONS

International Search Report of European Application No. 05809501.9-2203 / 1959495 PCT/JP2005021490 mailed Mar. 6, 2009.

* cited by examiner

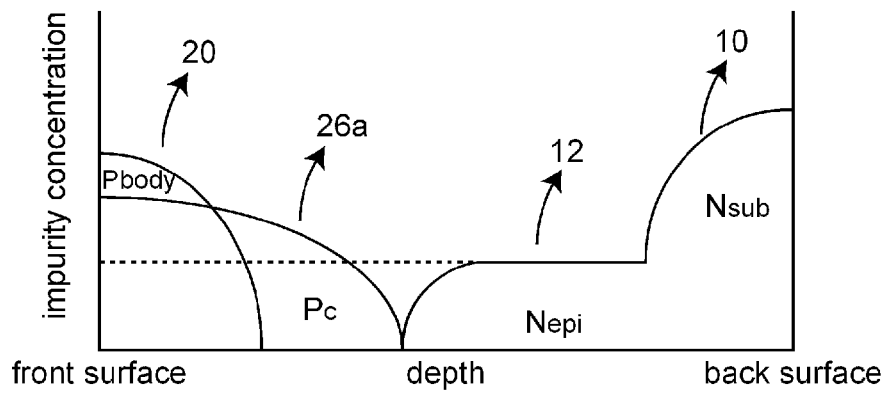
FIG.3
FIG.4
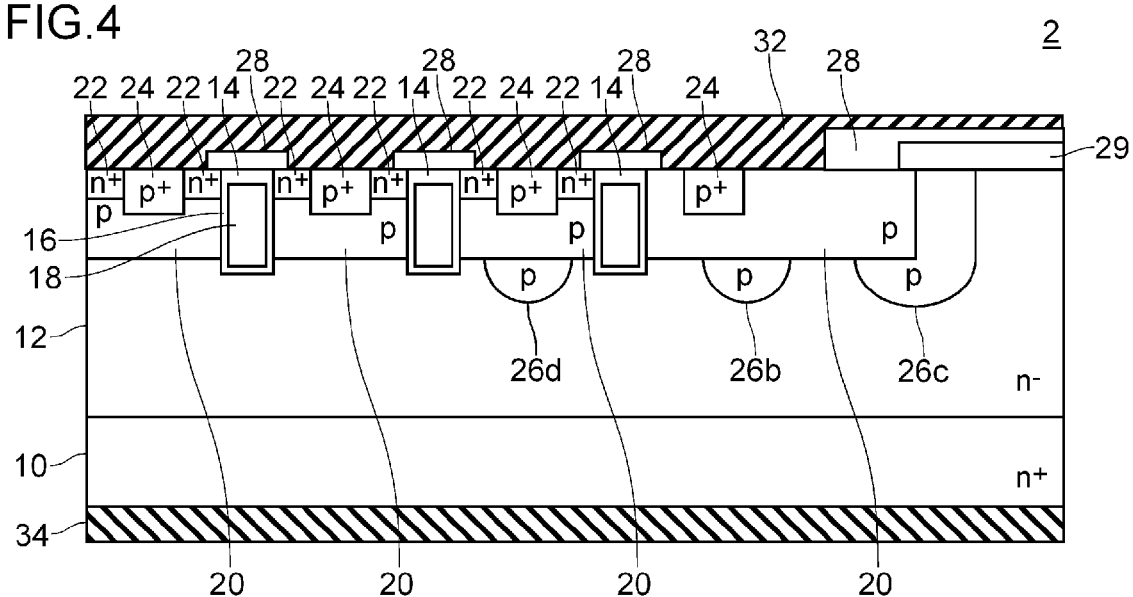
FIG.5
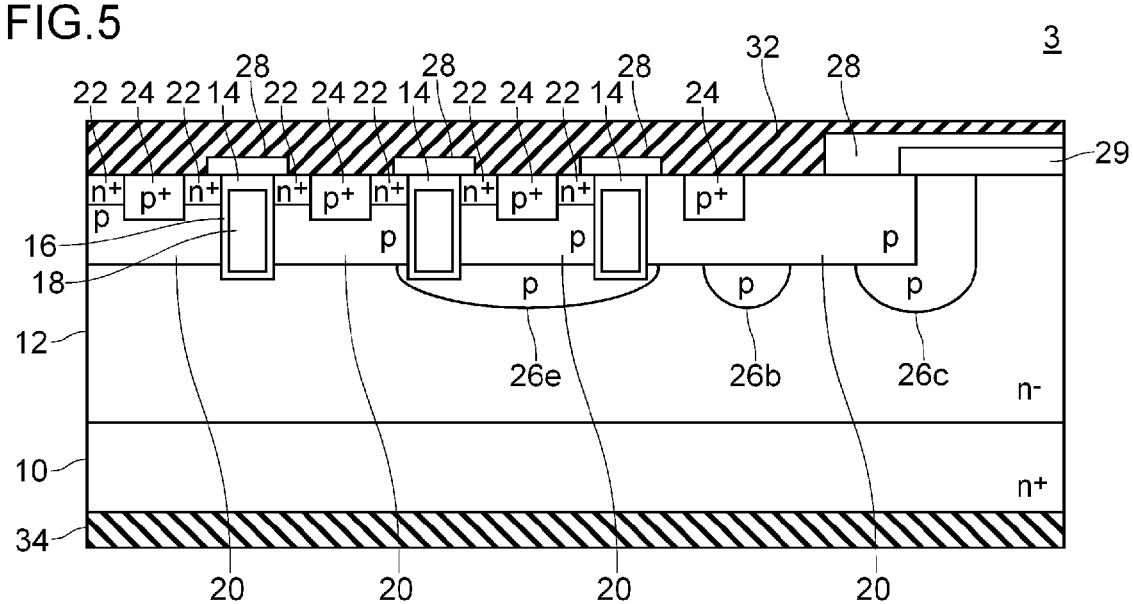

TRENCH GATE POWER SEMICONDUCTOR DEVICE

RELATED APPLICATIONS

The present application is based on, and claims priority from, International Application Number PCT/JP2005/021490, filed Nov. 22, 2005, the disclosure of which is hereby incorporated by reference herein in its entirety.

TECHNICAL FIELD

The present invention relates to a trench gate power semiconductor device.

BACKGROUND ART

FIG. 17 is a cross-sectional view of a conventional trench gate power semiconductor device 900.

As shown in FIG. 17, the conventional trench gate power semiconductor device 900 is a trench gate power semiconductor device which includes an $n^+$-type epitaxial layer 911 (not shown in the drawing) formed in the vicinity of a p-type semiconductor substrate 910 (not shown in the drawing) and a surface of the p-type semiconductor substrate 910, an $n^-$-type epitaxial layer 912 (a semiconductor layer of first conductive type) arranged on the $n^+$-type epitaxial layer 911, a p-type body region 920 (a body region of second conductive type) formed in the vicinity of an upper surface of the $n^-$-type epitaxial layer 912, a plurality of trenches 914 formed such that the trenches 914 reach the $n^-$-type epitaxial layer 912 from an upper surface side of the p-type body region 920, and gates 918 formed in the plurality of trenches 914 by way of gate insulation films 916. Emitter regions 922 are formed in the vicinity of an upper surface of the p-type body region 920 in an inter-trench region sandwiched between the trenches 914. An insulation layer 928 is formed over the trenches 914 and an emitter electrode 932 is formed over the insulation layer 928. Further, a cathode electrode 934 (not shown in the drawing) is formed over a lower surface of the p-type semiconductor substrate 910.

In the conventional trench gate power semiconductor device 900 having such a constitution, in a peripheral region GR which disposed further outside the outermost peripheral trench 914, a p-type semiconductor region 920a is formed such that the p-type semiconductor region 920a is connected to the p-type body region 920 and surrounds the p-type body region 920. The p-type semiconductor region 920a is formed deeper than the p-type body region 920 so as to maintain a high breakdown voltage thereof. The p-type semiconductor region 920a and the p-type body region 920 are connected to the emitter electrode 932 via contact holes CH formed in an upper surface of a side diffusion region SD and contact holes CH formed in an upper surface of a margin region MR adjacent to the side diffusion region SD. The emitter regions 922 are not formed on the upper surface of the margin region MR. Here, in FIG. 17, a symbol CR indicates a cell region.

Due to such constitution, according to the conventional trench gate power semiconductor device 900, most of the holes H generated in a relatively large quantity near the side diffusion region SD when a gate voltage is made to return from an ON voltage to an OFF voltage in the emitter electrode 932 pass through the side diffusion region SD and are collected by the emitter electrode 932 and hence, the holes can be speedily collected when the gate voltage is made to return to the OFF voltage thus accelerating a speed of the switching operation (for example, see patent document 1).

Patent document 1: Japan Published Unexamined Application No. Hei 9-270512 (FIG. 1 and FIG. 2)

DISCLOSURE OF THE INVENTION

Problems that the Invention is to Solve

The conventional trench gate power semiconductor device 900 can collect the relatively large quantity of holes H generated in the vicinity of the side diffusion region SD of the peripheral region GR disposed further outside the outermost peripheral trench 914. However, when the gate voltage is made to return from the ON voltage to the OFF voltage, a certain quantity of holes although smaller in quantity compared to the holes generated in the vicinity of the side diffusion region SD is generated also in the cell region CR and hence, there arises a drawback that the further acceleration of a speed of the switching operation is impeded.

The present invention has been made to overcome the above-mentioned drawback, and it is an object of the present invention to provide a trench gate power semiconductor device capable of effectively collecting holes generated in a cell region so as to further accelerate a speed of the switching operation.

Means for Solving the Problems (1) The present invention is directed to a trench gate power semiconductor device including a semiconductor layer of first conductive type, a body region of second conductive type opposite to the first conductive type, the body region formed in the vicinity of an upper surface of the semiconductor layer of first conductive type, a plurality of trenches formed so as to reach the semiconductor layer of first conductive type from an upper surface side of the body region of second conductive type, and gates formed in the plurality of trenches, wherein in some regions out of regions of the semiconductor layer of first conductive type facing the body region of second conductive type in an opposed manner, carrier extracting regions of second conductive type are formed.

Due to such constitution, according to the trench gate power semiconductor device of the present invention, the carrier extracting regions of second conductive type are formed in some regions out of regions of the semiconductor layer of first conductive type facing the body region of second conductive type in an opposed manner and hence, it is possible to form the carrier extracting regions of second conductive type at portions of a cell region where the collection of holes are required. Accordingly, the holes generated in the cell region can be efficiently collected through the carrier extracting regions of second conductive type thus providing a trench gate power semiconductor device which can further accelerate a speed of the switching operation.

(2) In the trench gate power semiconductor device having the constitution (1), the carrier extracting regions of second conductive type may preferably be formed such that the carrier extracting regions cover partial or whole regions of some trenches out of the plurality of trenches.

Due to such constitution, the carrier extracting region of second conductive type can be formed such that the carrier extracting region covers the partial or whole region of the trenches at portions where the collection of holes is required and hence, the holes can be efficiently collected. Further, also in this case, the carrier extracting region of second conductive type can be formed only in the partial or whole region of the necessary trenches out of the plurality of trenches and hence, there is no possibility that the ON resistance is excessively increased.

(3) In the trench gate power semiconductor device having the constitution (2), the carrier extracting region of second conductive type may preferably be formed such that the carrier extracting region covers a partial or whole region of the outermost trench out of the plurality of trenches.

Due to such constitution, the carrier extracting region of second conductive type can be formed such that the carrier extracting region covers the partial or whole region of some trenches at portions where the holes are liable to be easily generated and hence, the holes can be further efficiently collected.

(4) In the trench gate power semiconductor device having the constitution (1), the carrier extracting regions of second conductive type may preferably be formed in partial or whole regions of some inter-trench regions out of inter-trench regions which are respectively sandwiched between two neighboring trenches out of the plurality of trenches.

Also due to such constitution, the carrier extracting region of second conductive type can be formed in the partial or whole regions of the inter-trench regions at portions where the collection of holes is required and hence, the holes can be efficiently collected. Also in this case, the carrier extracting region of second conductive type can be formed only in the partial or whole regions of necessary inter-trench regions out of the plurality of inter-trench regions and hence, there is no possibility that the ON resistance is excessively increased.

(5) In the trench gate power semiconductor device having the constitution (4), the carrier extracting region of second conductive type may preferably be formed in a partial or whole region of the inter-trench region sandwiched between the outermost trench out of the plurality of trenches and the trench arranged close to the outermost trench.

Due to such constitution, the carrier extracting region of second conductive type can be formed in the partial or whole regions of some inter-trench regions at portions where the holes are liable to be easily generated and hence, the holes can be further efficiently collected.

(6) In the trench gate power semiconductor device having the constitution (1), the carrier extracting region of second conductive type may preferably be formed such that the carrier extracting region covers two neighboring trenches out of the plurality of trenches and an inter-trench region sandwiched between the two neighboring trenches.

Due to such constitution, an area of the carrier extracting region of second conductive type can be increased and hence, the holes can be efficiently collected.

(7) In the trench gate power semiconductor device having any one of the constitutions (2) to (6), the carrier extracting region of second conductive type may preferably be also formed in a peripheral region outside the outermost trench out of the plurality of trenches.

Due to such constitution, the carrier extracting region of second conductive type is formed also in the peripheral region which constitutes a region where a relatively large quantity of holes is generated and hence, the holes can be further efficiently collected.

(8) In the trench gate power semiconductor device having the constitution (7), the carrier extracting region of second conductive type formed in the peripheral region may preferably be formed on a lower surface side of the body region of second conductive type.

Due to such constitution, the carrier extracting region of second conductive type is formed on the lower surface of the body region of second conductive type in the peripheral region which constitutes the region where a relatively large quantity of holes is generated and hence, the holes can be further efficiently collected.

(9) In the trench gate power semiconductor device having the constitutions (7) or (8), the carrier extracting region of second conductive type formed in the peripheral region may preferably be formed such that the carrier extracting region covers a side surface of the body region of second conductive type.

Due to such constitution, the carrier extracting region of second conductive type is formed such that the carrier extracting region covers the side surface of the body region of second conductive type in the peripheral region which constitutes the region where a relatively large quantity of holes is generated and hence, the holes can be further efficiently collected.

(10) In the trench gate power semiconductor device having any one of the constitutions (1) to (9), the carrier extracting region of second conductive type may preferably be formed so as to reach a position of a depth larger than a depth of the trenches.

Due to such constitution, the impingement of holes on the lower surface of the trench can be suppressed and hence, damages applied to a gate insulation film formed in the vicinity of a bottom surface of the trench can be suppressed.

(11) The present invention is directed to a trench gate power semiconductor device including a semiconductor layer of first conductive type, a body region of second conductive type opposite to the first conductive type, the body region formed in the vicinity of an upper surface of the semiconductor layer of first conductive type, a plurality of trenches formed so as to reach the semiconductor layer of first conductive type from an upper surface side of the body region of second conductive type, and gates formed in the plurality of trenches, wherein a second trench of a depth smaller than a depth of the body region of second conductive type and including a metal layer connected with an electrode different from a gate electrode out of electrodes formed on an upper surface of the semiconductor layer of first conductive type therein is formed in the body region of second conductive type, and a carrier extracting region of second conductive type is formed on a lower surface of the second trench such that the carrier extracting region is connected to the metal layer and reaches the semiconductor layer of first conductive type.

Due to such constitution, according to another trench gate power semiconductor device of the present invention, the second trench is formed in the inter-trench region and the carrier extracting region of second conductive type is formed on the lower surface of the second trench and hence, the carrier extracting region of second conductive type can be formed at a portion of a cell region where the collection of holes is required. Accordingly, the holes generated in the cell region can be efficiently collected through the carrier extracting region of second conductive type and hence, it is possible to provide the trench gate power semiconductor device which can further accelerate a speed of the switching operation.

(12) In the trench gate power semiconductor device having the constitution (11), the second trench may preferably be formed in all inter-trench regions which are respectively sandwiched between two neighboring trenches out of the plurality of trenches.

Due to such constitution, the carrier extracting region of second conductive type can be formed over the whole surface of the cell region and hence, the holes can be efficiently collected. In this case, even when the carrier extracting region of second conductive type is formed over the whole surface of the cell region, it is possible to prevent the carrier extracting region from considerably ill-affecting a transistor operation and hence, there is no possibility that the switching performance is excessively lowered.

(13) In the trench gate power semiconductor device having the constitution (11), the second trench may preferably be formed in some regions out of all inter-trench regions which are respectively sandwiched between two neighboring trenches out of the plurality of trenches.

Due to such constitution, the carrier extracting region of second conductive type can be formed only at necessary portions of the cell region and hence, the adverse influence exerted on a transistor operation can be minimized.

(14) In the trench gate power semiconductor device having the constitution (11), the second trench may preferably be formed in partial or whole regions of some inter-trench regions out of inter-trench regions which are respectively sandwiched between two neighboring trenches out of the plurality of trenches.

Also due to such constitution, the carrier extracting region of second conductive type can be formed only at necessary portions of the cell region and hence, the adverse influence exerted on a transistor operation can be minimized.

(15) In the trench gate power semiconductor device having the constitution (11), the second trench may preferably be formed in a peripheral region further outside the outermost trench out of the plurality of trenches.

Due to such constitution, the carrier extracting region of second conductive type is formed in the peripheral region which constitutes a region where a relatively large quantity of holes is generated and hence, the holes can be further efficiently collected.

(16) In the trench gate power semiconductor device having any one of the constitutions (12) to (14), the second trench may preferably be formed in a peripheral region further outside the outermost trench out of the plurality of trenches.

Due to such constitution, the carrier extracting region of second conductive type is also formed in the peripheral region which constitutes a region where a relatively large quantity of holes is generated and hence, the holes can be further efficiently collected.

(17) In the trench gate power semiconductor device having the constitution (16), the second trench formed in the peripheral region may preferably have a width larger than a width of the second trench formed in the inter-trench region.

Due to such constitution, the carrier extracting region of second conductive type having a large area is formed in the peripheral region which constitutes a region where a relatively large quantity of holes is generated and hence, the holes which are generated in a relatively large quantity can be further efficiently collected.

(18) In the trench gate power semiconductor device having the constitutions (16) or (17), the carrier extracting region of second conductive type formed in the peripheral region may preferably be formed so as to reach a position deeper than the carrier extracting region of second conductive type formed in the inter-trench region.

Due to such constitution, the deep carrier extracting region of second conductive type is formed in the peripheral region which constitutes a region where a relatively large quantity of holes is generated and hence, the holes which are generated in a relatively large quantity can be further efficiently collected.

(19) In the trench gate power semiconductor device having anyone of the constitutions (11) to (18), the carrier extracting region of second conductive type may preferably be formed so as to reach a position of a depth larger than a depth of the trench.

Due to such constitution, the impingement of holes on the lower surface of the trench can be suppressed and hence, damages applied to a gate insulation film formed in the vicinity of a bottom surface of the trench can be suppressed.

(20) In the trench gate power semiconductor device having any one of the constitutions (11) to (19), on a portion of the carrier extracting region of second conductive type which is brought into contact with the second trench, a contact layer for reducing contact resistance with the metal layer filled in the inside of the second trench may preferably be formed.

Due to such constitution, the holes collected by the carrier extracting region of second conductive type can be efficiently discharged to the outside.

(21) In the trench gate power semiconductor device having any one of the constitutions (1) to (20), the trench gate power semiconductor device may be a power MOSFET.

Due to such constitution, it is possible to provide a trench gate power MOSFET which can further accelerate a speed of the switching operation.

(22) In the trench gate power semiconductor device having any one of the constitutions (1) to (20), the trench gate power semiconductor device may be an IGBT.

Due to such constitution, it is possible to provide a trench gate IGBT which can further accelerate a speed of the switching operation.

BRIEF DESCRIPTION OF THE DRAWINGS

FIG. 3 is a view showing an impurity concentration profile in the depth direction in the trench gate power MOSFET 1 according to the embodiment 1.

FIG. 4 is a cross-sectional view for explaining a trench gate power MOSFET 2 according to an embodiment 2.

FIG. 5 is a cross-sectional view for explaining a trench gate power MOSFET 3 according to an embodiment 3.

BEST MODE FOR CARRYING OUT THE INVENTION

Embodiments of the present invention are explained in detail in conjunction with drawings hereinafter.

Embodiment 1

Figure 1:
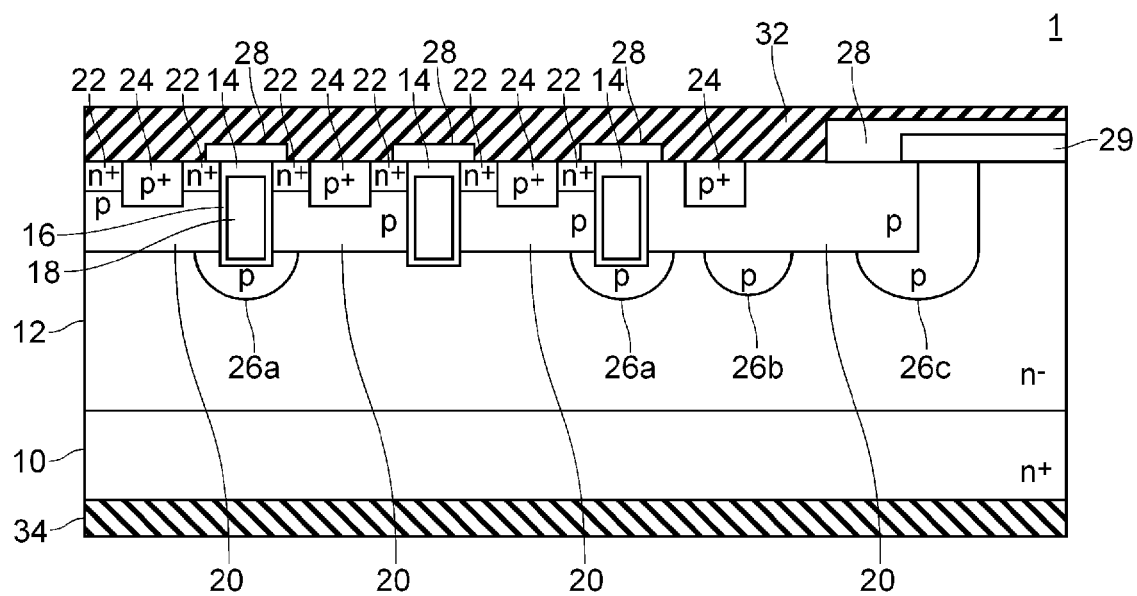
FIG. 1 is a cross-sectional view for explaining a trench gate power MOSFET 1 according to an embodiment 1.
Figure 2:
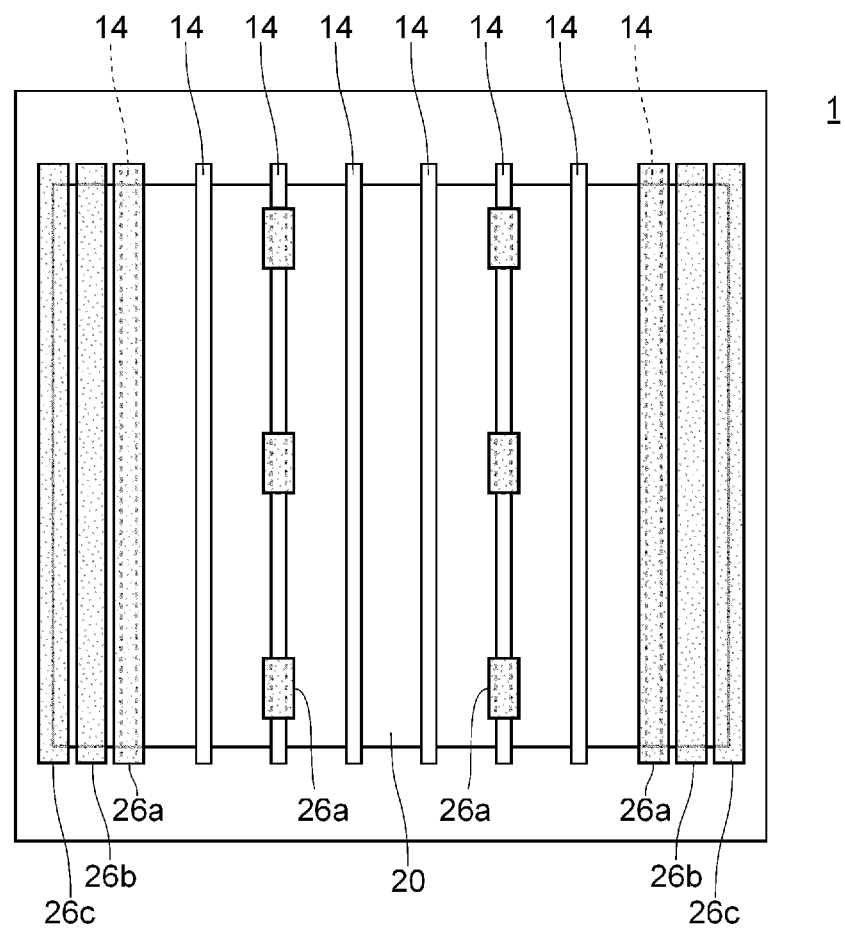
FIG. 2 is a plan view for explaining the trench gate power MOSFET 1 according to the embodiment 1.

FIG. 1 is a cross-sectional view for explaining a trench gate power MOSFET 1 according to an embodiment 1. FIG. 2 is a plan view for explaining the trench gate power MOSFET 1 according to the embodiment 1.

The trench gate power MOSFET 1 according to the embodiment 1 is, as shown in FIG. 1 and FIG. 2, constituted of an $n^-$-type epitaxial layer (semiconductor layer of first conductive type) 12 formed on an upper surface of an $n^+$-type silicon substrate 10, a p-type body region (body region of second conductive type) 20 formed in the vicinity of an upper surface of the $n^-$-type epitaxial layer 12, a plurality of trenches 14 formed such that the trenches 14 reach the $n^-$-type epitaxial layer 12 from an upper surface side of the p-type body region 20, and gates 18 respectively formed in the plurality of trenches 14. Further, p-type carrier extracting regions 26a, 26b, 26c are formed in some regions out of regions of the $n^-$-type epitaxial layer 12 facing the p-type body region 20 in an opposed manner. In FIG. 1, numeral 22 indicates an $n^+$-type source region, numeral 24 indicates a $p^+$-type contact region, numeral 28 and numeral 29 indicate insulation layers, numeral 32 indicates a source electrode, and numeral 34 indicates a drain electrode.

Due to such constitution, according to the trench gate power MOSFET 1 of the embodiment 1, the p-type carrier extracting regions 26a, 26b, 26c are formed in some regions out of regions of the $n^-$-type epitaxial layer 12 facing the p-type body region 20 in an opposed manner and hence, it is possible to form the p-type carrier extracting regions 26a, 26b, 26c at portions of a cell region where the collection of holes are required. Accordingly, the holes generated in the cell region can be efficiently collected through the p-type carrier extracting regions 26a, 26b, 26c thus providing a trench gate power MOSFET which can further accelerate a speed of the switching operation.

Out of the p-type carrier extracting regions 26a, 26b, 26c, the p-type carrier extracting region 26a which is present in the cell region is, as shown in FIG. 2, formed such that the p-type carrier extracting regions 26a cover partial or whole regions of some trenches out of the plurality of trenches 14.

Due to such constitution, the p-type carrier extracting regions 26a can be formed such that the p-type carrier extracting regions 26a cover the partial or whole regions of the trenches at portions where the collection of holes is required and hence, the holes can be efficiently collected. Further, also in this case, the p-type carrier extracting regions 26a can be formed only in the partial or whole regions of the necessary trenches out of the plurality of trenches 14 and hence, there is no possibility that the ON resistance is excessively increased.

Further, the p-type carrier extracting regions 26a are, as shown in FIG. 2, formed such that the p-type carrier extracting regions 26a cover the whole regions of the outermost trenches out of the plurality of trenches 14.

Due to such constitution, by forming the p-type carrier extracting regions 26a such that the p-type carrier extracting regions 26a cover the whole regions of some trenches at portions where the holes are liable to be easily generated, the holes can be further efficiently collected.

Out of the p-type carrier extracting regions 26a, 26b, 26c, the p-type carrier extracting regions 26b, 26c which are present in the peripheral region are, as shown in FIG. 1 and FIG. 2, formed in a peripheral region outside the outermost trench out of the plurality of trenches 14.

Due to such constitution, the p-type carrier extracting regions 26b, 26c are formed in the peripheral region which constitutes a region where a relatively large quantity of holes is generated and hence, the holes can be further efficiently collected.

Here, the p-type carrier extracting region 26b is formed on a lower surface side of the p-type body region 20, and the p-type carrier extracting region 26c is formed to cover the side surface of the p-type body region 20.

Due to such constitution, the p-type carrier extracting regions 26b, 26c are respectively formed on the lower surface of the p-type body region 20 and on the side surface of the p-type body region 20 in the peripheral region which constitutes the region where a relatively large quantity of holes is generated and hence, the holes can be further efficiently collected.

Further, in the trench gate power MOSFET 1 according to the embodiment 1, the p-type carrier extracting regions 26a, 26b, 26c are formed so as to reach a position of a depth larger than a depth of the trenches 14.

Due to such constitution, the impingement of holes on the lower surface of the trench 14 is suppressed and hence, damages applied to a gate insulation film 16 formed in the vicinity of a bottom surface of the trench 14 can be suppressed.

FIG. 3 is a view showing an impurity concentration profile in the depth direction in the trench gate power MOSFET 1 according to the embodiment 1.

In the trench gate power MOSFET 1 according to the embodiment 1, the p-type carrier extracting region 26a is, as shown in FIG. 3, formed so as to reach a position deeper than the p-type body region 20. Further, the impurity concentration of the p-type carrier extracting region 26a is lower than the impurity concentration of the p-type body region 20. Due to such setting of the impurity concentration, the carrier extracting operation can be performed efficiently.

Embodiment 2

FIG. 4 is a cross-sectional view for explaining a trench gate power MOSFET 2 according to an embodiment 2.

The trench gate power MOSFET 2 according to the embodiment 2 basically has the structure considerably similar to the structure of the trench gate power MOSFET 1 according to the embodiment 1. However, the trench gate power MOSFET 2 according to the embodiment 2 differs from the trench gate power MOSFET 1 according to the embodiment 1 with respect to the constitution of the p-type carrier extracting regions present in the cell region. That is, in the trench gate power MOSFET 2 according to the embodiment 2, the p-type carrier extracting regions 26d present in the cell region are, as shown in FIG. 4, formed in some inter-trench regions out of the inter-trench regions respectively sandwiched between two neighboring trenches out of the plurality of trenches 14.

In this manner, the trench gate power MOSFET 2 according to the embodiment 2 differs from the trench gate power MOSFET 1 according to the embodiment 1 with respect to the constitution of the p-type carrier extracting regions present in the cell region. However, the p-type carrier extracting regions 26d, 26b, 26c are formed in some regions out of the regions of the $n^-$-type epitaxial layer 12 facing the p-type body region 20 in an opposed manner and hence, it is possible to form the p-type carrier extracting regions 26d, 26b, 26c at portions of the cell region where the collection of holes is required.

Accordingly, the holes generated in the cell region can be efficiently collected through the p-type carrier extracting regions 26d, 26b, 26c and hence, it is possible to provide the trench gate power MOSFET which can further accelerate a speed of the switching operation.

Further, in the trench gate power MOSFET 2 according to the embodiment 2, the p-type carrier extracting regions 26d are formed in partial or whole regions of some inter-trench regions out of inter-trench regions which are respectively sandwiched between two neighboring trenches out of the plurality of trenches 14. Accordingly, the p-type carrier extracting regions 26d can be formed only in the regions where the collection of holes is required and hence, there is no possibility that the ON resistance is excessively increased.

Further, in the trench gate power MOSFET 2 according to the embodiment 2, although not shown explicitly in FIG. 4, the p-type carrier extracting region 26d is formed in all regions respectively sandwiched between the outermost trench 14 out of the plurality of trenches 14 and the trench 14 arranged close to the outermost trench 14.

Due to such constitution, the p-type carrier extracting region can be formed in all inter-trench regions at portions where the holes are liable to be easily generated and hence, the holes can be further efficiently collected.

Embodiment 3

FIG. 5 is a cross-sectional view for explaining the trench gate power MOSFET 3 according to an embodiment 3.

The trench gate power MOSFET 3 according to the embodiment 3 basically has the structure considerably similar to the structure of the trench gate power MOSFET 1 according to the embodiment 1. However, the trench gate power MOSFET 3 according to the embodiment 3 differs from the trench gate power MOSFET 1 according to the embodiment 1 with respect to the constitution of the p-type carrier extracting region present in the cell region. That is, in the trench gate power MOSFET 3 according to the embodiment 3, the p-type carrier extracting region 26e present in the cell region is, as shown in FIG. 5, formed such that the p-type carrier extracting region 26e covers two neighboring trenches 14 out of the plurality of trenches 14 and an inter-trench region sandwiched between two neighboring trenches 14.

In this manner, the trench gate power MOSFET 3 according to the embodiment 3 differs from the trench gate power MOSFET 1 according to the embodiment 1 with respect to the constitution of the p-type carrier extracting region present in the cell region. However, the p-type carrier extracting regions 26e, 26b, 26c are formed in some regions out of the regions of the n⁻-type epitaxial layer 12 facing the p-type body region 20 in an opposed manner and hence, it is possible to form the p-type carrier extracting regions 26e, 26b, 26c at portions of the cell region where the collection of holes is required. Accordingly, the holes generated in the cell region can be efficiently collected through the p-type carrier extracting regions 26e, 26b, 26c and hence, it is possible to provide the trench gate power MOSFET which can further accelerate a speed of the switching operation.

Further, according to the trench gate power MOSFET 3 of the embodiment 3, as described above, the p-type carrier extracting region 26e is formed such that the p-type carrier extracting region 26e covers two neighboring trenches 14 out of the plurality of trenches 14 and the inter-trench region sandwiched between the two neighboring trenches 14. Accordingly, an area of the p-type carrier extracting region can be increased and hence, the holes can be efficiently collected.

Embodiment 4

The trench gate power MOSFET 4 according to an embodiment 4 (not shown in the drawing) basically has the structure considerably similar to the structure of the trench gate power MOSFET 1 according to the embodiment 1. However, the trench gate power MOSFET 4 according to the embodiment 4 differs from the trench gate power MOSFET 1 according to the embodiment 1 with respect to the constitution of the p-type carrier extracting region present in the cell region. That is, in the trench gate power MOSFET 4 according to the embodiment 4, the p-type carrier extracting region present in the cell region includes all of p-type carrier extracting regions 26a, 26b, 26c, 26d, 26e respectively formed in the trench gate power MOSFET 1 according to the embodiment 1, in the trench gate power MOSFET 2 according to the embodiment 2 or in the trench gate power MOSFET 3 according to the embodiment 3.

In this manner, the trench gate power MOSFET 4 according to the embodiment 4 differs from the trench gate power MOSFETs 1, 2 and 3 according to the embodiments 1, 2 and 3 with respect to the constitution of the p-type carrier extracting region present in the cell region. However, the p-type carrier extracting regions are formed in some regions out of the regions of the n⁻-type epitaxial layer 12 facing the p-type body region 20 in an opposed manner and hence, it is possible to form the p-type carrier extracting regions at portions of the cell region where the collection of holes is required. Accordingly, the holes generated in the cell region can be efficiently collected through the p-type carrier extracting regions and hence, it is possible to provide the trench gate power MOSFET which can further accelerate a speed of the switching operation.

Further, according to the trench gate power MOSFET 4 of the embodiment 4, the p-type carrier extracting regions suitably selected from the above-mentioned p-type carrier extracting regions can be arranged at the portions where the collection of holes is required and hence, it is possible to arrange the p-type carrier extracting regions such that the holes can be further efficiently collected.

Embodiment 5

Figure 6:
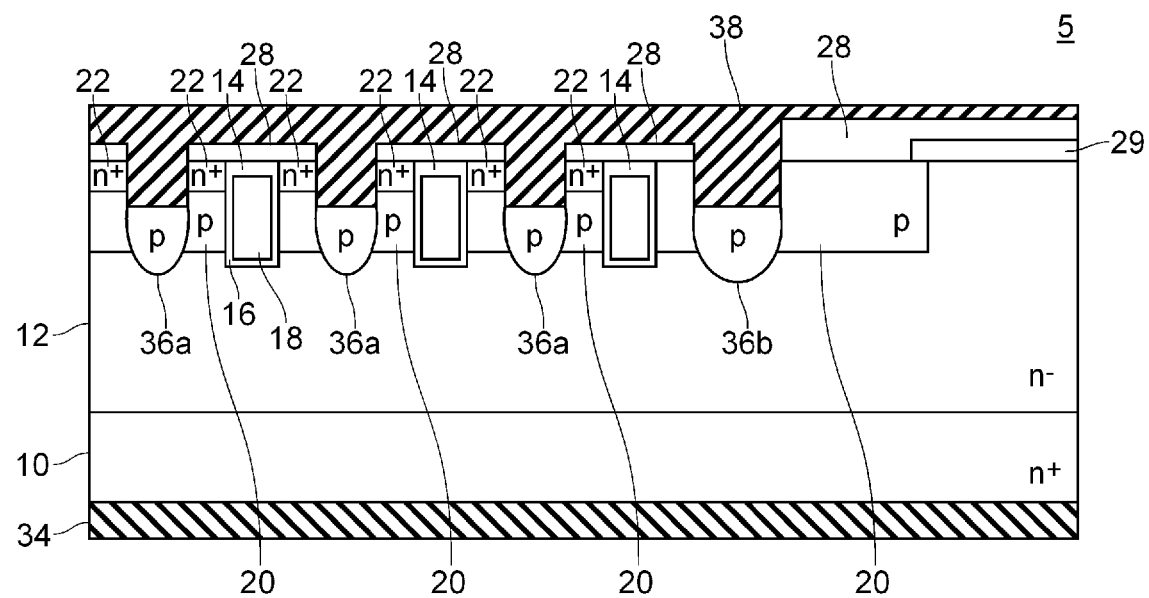
FIG. 6 is a cross-sectional view for explaining a trench gate power MOSFET 5 according to an embodiment 5.
Figure 7:
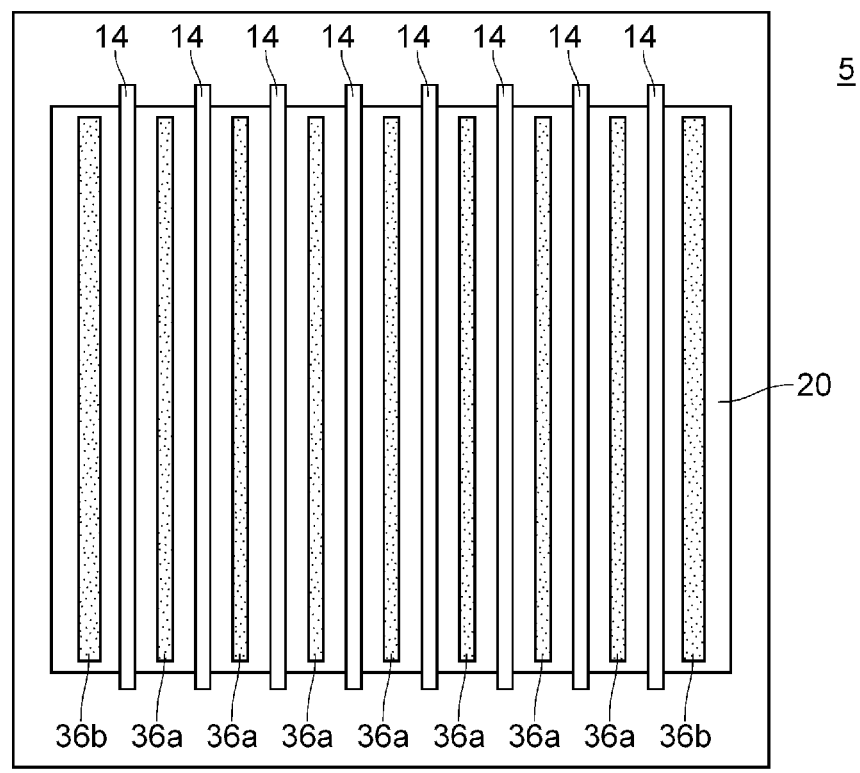
FIG. 7 is a plan view for explaining the trench gate power MOSFET 5 according to the embodiment 5.

FIG. 6 is a cross-sectional view for explaining a trench gate power MOSFET 5 according to an embodiment 5. FIG. 7 is a plan view for explaining the trench gate power MOSFET 5 according to the embodiment 5.

The trench gate power MOSFET 5 according to the embodiment 5 is constituted of an n⁻-type epitaxial layer (semiconductor layer of first conductive type) 12, a p-type body region (body region of second conductive type) 20 formed in the vicinity of an upper surface of the n⁻-type epitaxial layer 12, a plurality of trenches 14 formed such that the trenches 14 reach the n⁻-type epitaxial layer 12 from an upper surface side of the p-type body region 20, and gates 18 respectively formed in the plurality of trenches 14, wherein second trenches of a depth smaller than a depth of the p-type body region 20 and including a source electrode 38 formed on an upper surface of the p-type body region therein are formed in the p-type body region 20, and the p-type carrier extracting regions 36a, 36b are formed on lower surfaces of the second trenches such that the p-type carrier extracting regions 36a, 36b are connected to the source electrode 38 and reach the n⁻-type epitaxial layer 12.

Due to such constitution, according to the trench gate power MOSFET 5 of the embodiment 5, the second trenches are formed in the inter-trench regions and the p-type carrier extracting regions 36a, 36 are formed on the lower surfaces of the second trenches and hence, it is possible to form the p-type carrier extracting regions 36a at portions of the cell region where the collection of holes is required. Accordingly, the holes generated in the cell region can be efficiently collected through the p-type carrier extracting regions 36a thus providing a trench gate power MOSFET which can further accelerate a speed of the switching operation.

In the trench gate power MOSFET 5 according to the embodiment 5, the second trenches are, as shown in FIG. 6, formed in all inter-trench regions which are respectively sandwiched between two neighboring trenches 14 out of the plurality of trenches 14.

Due to such constitution, the p-type carrier extracting regions 36a can be formed over the whole surface of the cell region and hence, the holes can be efficiently collected. In this case, even when the p-type carrier extracting regions 36a are formed over the whole surface of the cell region, it is possible to prevent the carrier extracting regions from considerably ill-affecting a transistor operation and hence, there is no possibility that the switching performance is excessively lowered.

Further, in the trench gate power MOSFET 5 according to the embodiment 5, the second trench is, as shown in FIG. 6, also formed in the peripheral region further outside the outermost trench out of the plurality of trenches 14.

Due to such constitution, the p-type carrier extracting region 36b is formed also in the peripheral region which constitutes a region where a relatively large quantity of holes is generated and hence, the holes can be further efficiently collected.

Further, in the trench gate power MOSFET 5 according to the embodiment 5, the second trench formed in the peripheral region has a width larger than a width of the second trench formed in the cell region.

Due to such constitution, by forming the p-type carrier extracting region 36b having a large area in the peripheral region which constitutes a region where a relatively large quantity of holes is generated, the holes generated in a relatively large quantity can be further efficiently collected.

Further, in the trench gate power MOSFET 5 according to the embodiment 5, the p-type carrier extracting region 36b formed in the peripheral region is formed so as to reach a position deeper than the p-type carrier extracting region 36a formed in the cell region.

Due to such constitution, by forming the deep p-type carrier extracting region 36b in the peripheral region where a relatively large quantity of holes is generated, the holes generated in a relatively large quantity can be further efficiently collected.

Further, in the trench gate power MOSFET 5 according to the embodiment 5, the p-type carrier extracting region 36b is formed so as to reach a position of a depth larger than a depth of the trench 14.

Due to such constitution, it is possible to prevent the impingement of holes on a lower surface of the trench 14 and hence, damages applied to the gate insulation film 16 formed in the vicinity of the bottom surface of the trench 14 can be suppressed.

Further, in the trench gate power MOSFET 5 according to the embodiment 5, on portions of the p-type carrier extracting regions 36a, 36b which are brought into contact with the second trenches, p⁺-type contact layers 24 for reducing contact resistance with the metal layer (source electrode 38) filled in the inside of the second trenches are formed.

Due to such constitution, the holes collected by the p-type carrier extracting regions 36a, 36b can be efficiently discharged to the outside.

Figure 8:
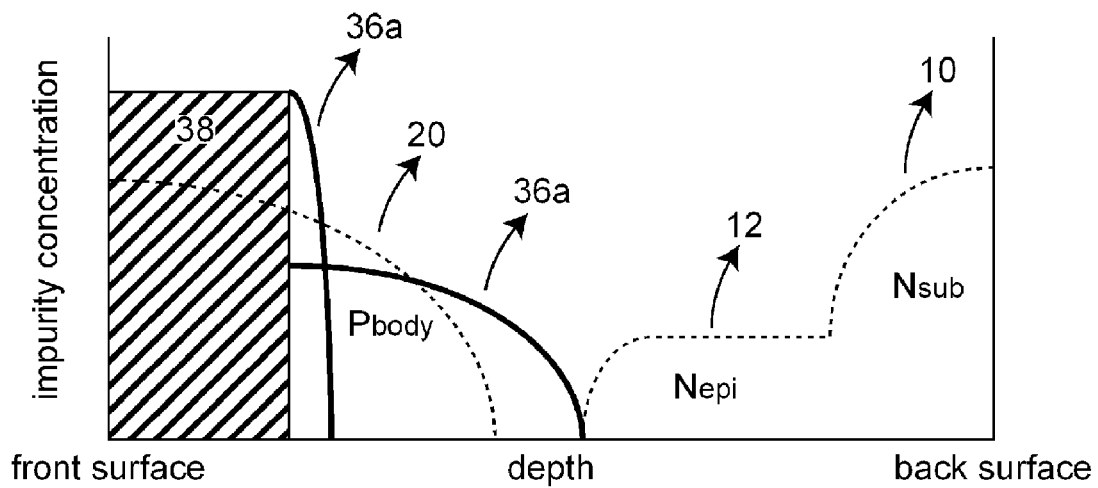
FIG. 8 is a view showing an impurity concentration profile in the depth direction in the trench gate power MOSFET 5 according to the embodiment 5.

FIG. 8 is a view showing an impurity concentration profile in the depth direction of the trench gate power MOSFET 5 according to the embodiment 5, In the trench gate power MOSFET 5 according to the embodiment 5, the p-type carrier extracting region 36a is, as shown in FIG. 8, formed so as to reach a position deeper than the p-type body region 20. Further, the impurity concentration of the p-type carrier extracting region 36a is lower than the impurity concentration of the p-type body region 20. However, the impurity concentration of the p-type carrier extracting region 36a is higher than the impurity concentration of the p-type body region 20 at the p⁺-type contact layer 24. Due to such setting of the profile concentration, the carrier extracting operation can be performed efficiently.

Embodiment 6

Figure 9:
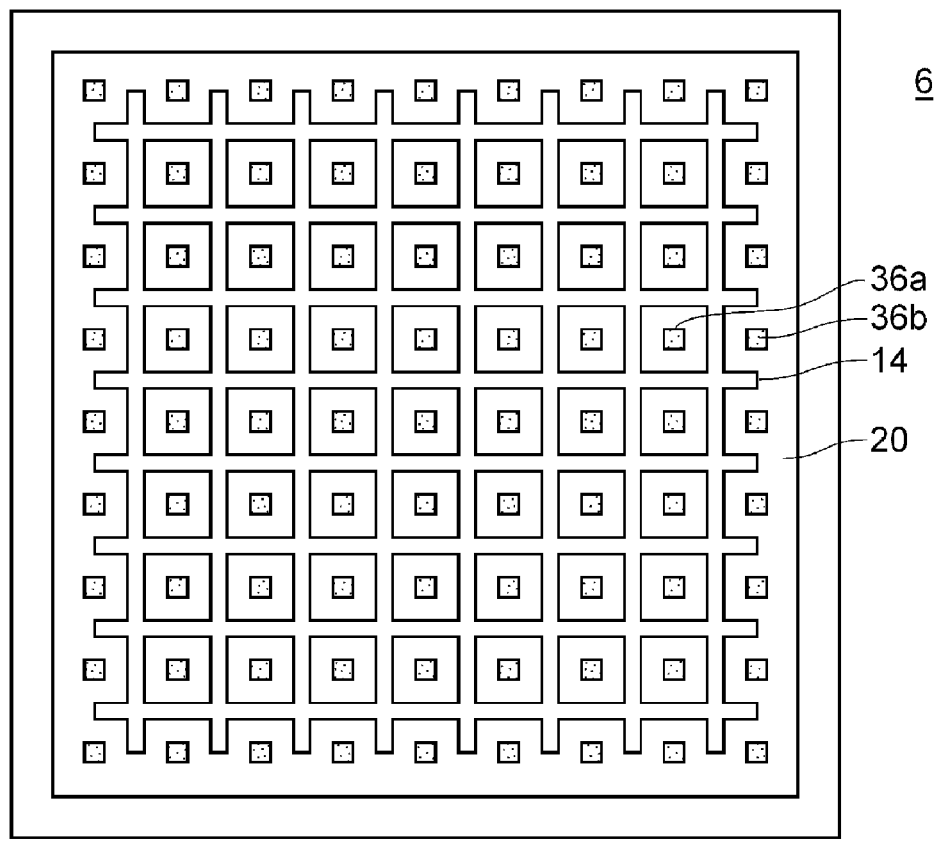
FIG. 9 is a plan view for explaining a trench gate power MOSFET 6 according to an embodiment 6.

FIG. 9 is a plan view for explaining a trench gate power MOSFET 6 according to an embodiment 6.

The trench gate power MOSFET 6 according to the embodiment 6 basically has the structure considerably similar to the structure of the trench gate power MOSFET 5 according to the embodiment 5. However, the trench gate power MOSFET 6 according to the embodiment 6 differs from the trench gate power MOSFET 5 according to the embodiment 5 with respect to a layout of the trenches 14. That is, in the trench gate power MOSFET 6 according to the embodiment 6, the trenches 14 have the lattice structure as shown in FIG. 9.

Although the trench gate power MOSFET 6 according to the embodiment 6 differs from the trench gate power MOSFET 5 according to the embodiment 5 with respect to the layout of the trenches 14, in the trench gate power MOSFET 6 according to the embodiment 6, the second trenches are formed in inter-trench regions and p-type carrier extracting regions 36a, 36b are also formed on lower surfaces of the second trenches and hence, it is possible to form the p-type carrier extracting regions 36a at positions in a cell region where the collection of holes is required. Accordingly, the holes generated in the cell region can be efficiently collected through the p-type carrier extracting regions 36a thus providing a trench gate power semiconductor device which can further accelerate a speed of the switching operation.

Embodiment 7

A manufacturing method of a trench gate power MOSFET according to an embodiment 7 is a manufacturing method of manufacturing a trench gate power MOSFET provided for manufacturing the above-mentioned trench gate power MOSFET 4 according to the embodiment 4.

FIG. 10 to FIG. 12 are views showing respective manufacturing steps of the method of manufacturing the trench gate power MOSFET according to the embodiment 7.

The method of manufacturing the trench gate power MOSFET according to the embodiment 7 includes, as shown in FIG. 10 to FIG. 12, following steps consisting of (a) a first step to (i) a ninth step executed in this order.

(a) First Step

Figure 10A:
FIGS. 10A-C are views showing respective manufacturing steps of a manufacturing method of a trench gate power MOSFET according to an embodiment 7.
Figure 10B:
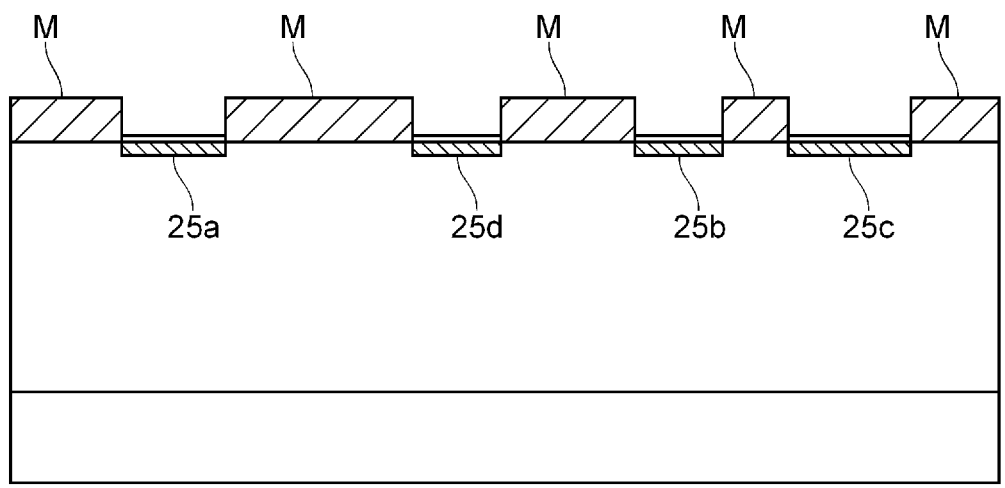

The n$^+$-type silicon substrate 10 which forms an n$^-$-type epitaxial layer 12 on an upper surface thereof is prepared (see FIG. 10(a)). The impurity concentration of the n$^-$-type epitaxial layer 12 is, for example, $3\times10^{+15}$ atoms/cm$^3$.

(b) Second Step

Next, a silicon oxide film M is selectively formed on a surface of the n$^-$-type epitaxial layer 12. Using the silicon oxide film M as a mask, for example, boron ions (for example, $2.6\times10^{13}$ cm$^{-2}$) are implanted thus forming boron-ion-implanted layers 25a, 25d, 25b, 25c (see FIG. 10(b)).

(c) Third Step

Figure 10C:
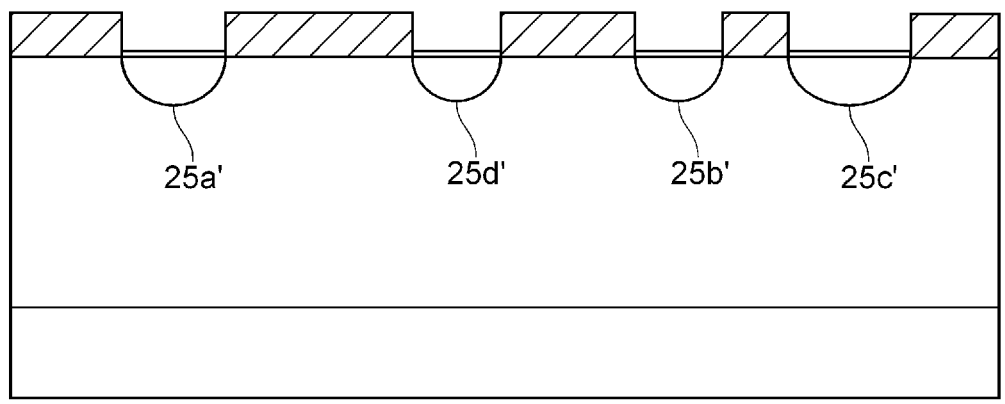

Next, thermal annealing is performed (for example, at a temperature of 1100° C. for 100 minutes) thus forming the p-type diffusion layers 25a', 25d', 25b', 25c' which constitute the p-type carrier extracting regions (see FIG. 10(c)).

(d) Fourth Step

Figure 11D:
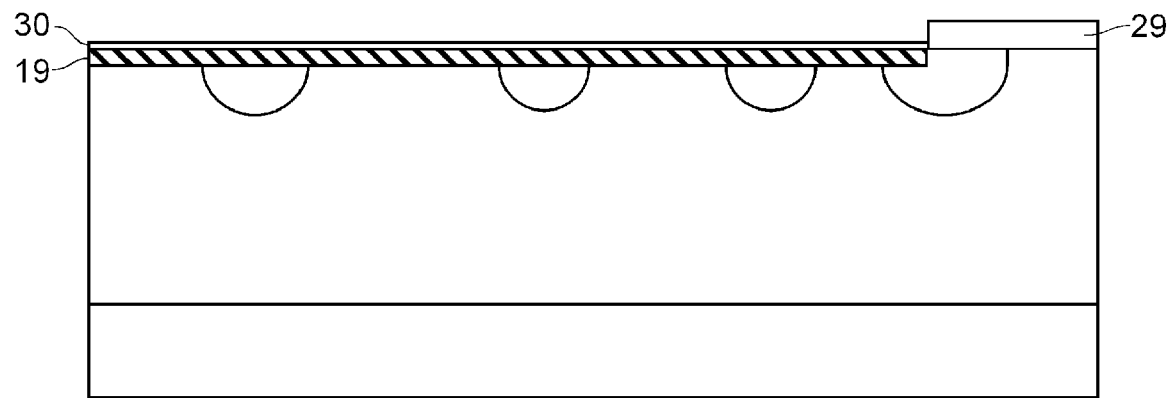
FIGS. 11D-F are views showing respective manufacturing steps of the manufacturing method of the trench gate power MOSFET according to the embodiment 7.

Next, after removing the silicon oxide film M, using an insulation film 29 as a mask, for example, boron ions (for example, $1.5\times10^{13}$ cm$^{-2}$, 50 keV) are implanted thus forming a boron-ion-implanted layer 19 (see FIG. 11(d)). Here, numeral 30 indicates a thermal oxidized film having a thickness of approximately 20 to 40 nm.

(e) Fifth Step

Figure 11E:
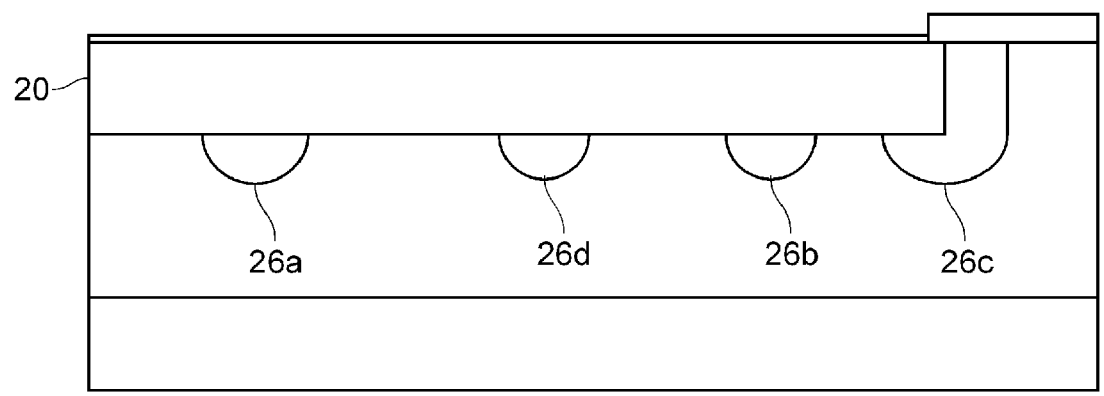
Figure 11F:
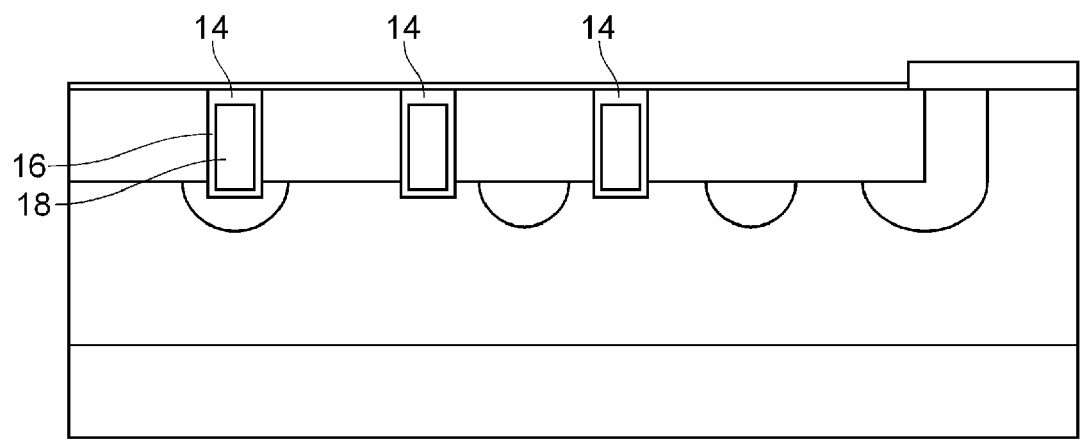

Next, thermal annealing is performed (for example, at a temperature of 1100° C. for 45 minutes) thus forming the p-type body region 20 (see FIG. 11(e)). Here, the p-type carrier extracting regions 26a, 26d, 26b, 26c are simultaneously formed.

(f) Sixth Step

Next, the trenches 14 are formed using a silicon oxide film (not shown in the drawing) as a mask. After removing the silicon oxide film, a gate insulation film 16 is formed on inner surfaces of the trenches 14 by thermal oxidation. Thereafter, the inside of the trenches is filled with polysilicon doped with phosphors, an upper surface of the polysilicon is etched back, and the upper surface is thermally oxidized to form gates 18 (see FIG. 11(f)).

(g) Seventh Step

Figure 12G:
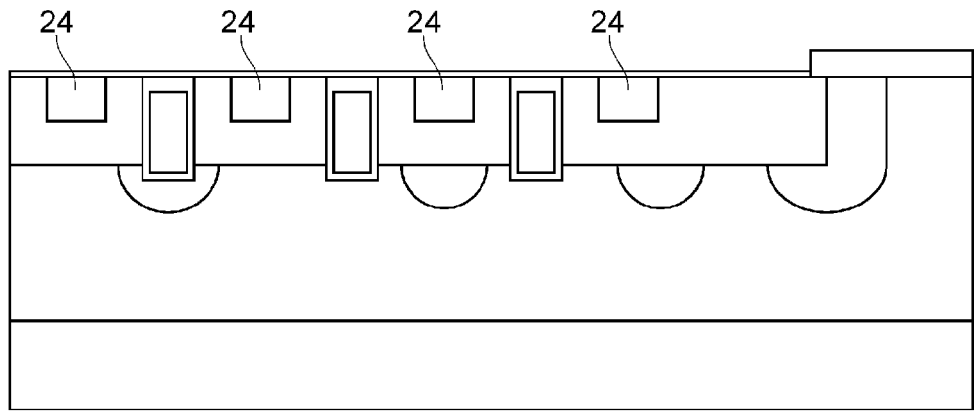
FIGS. 12G-I are views showing respective manufacturing steps of the manufacturing method of the trench gate power MOSFET according to the embodiment 7.
Figure 12H:
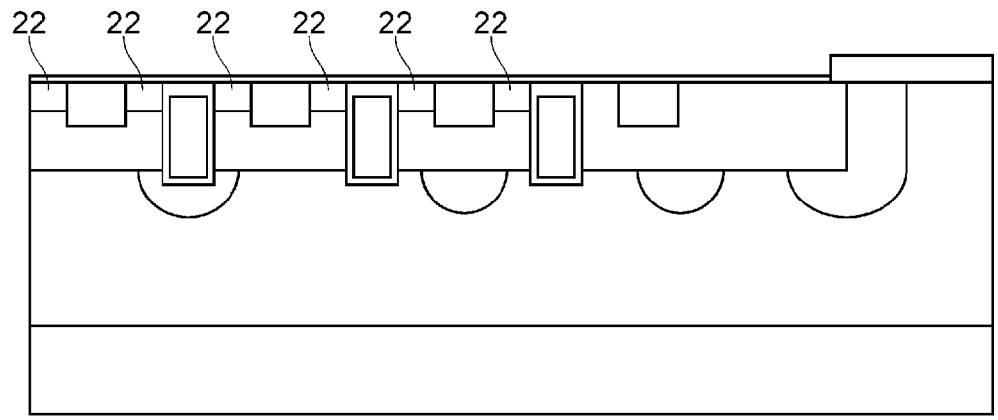
Figure 12I:
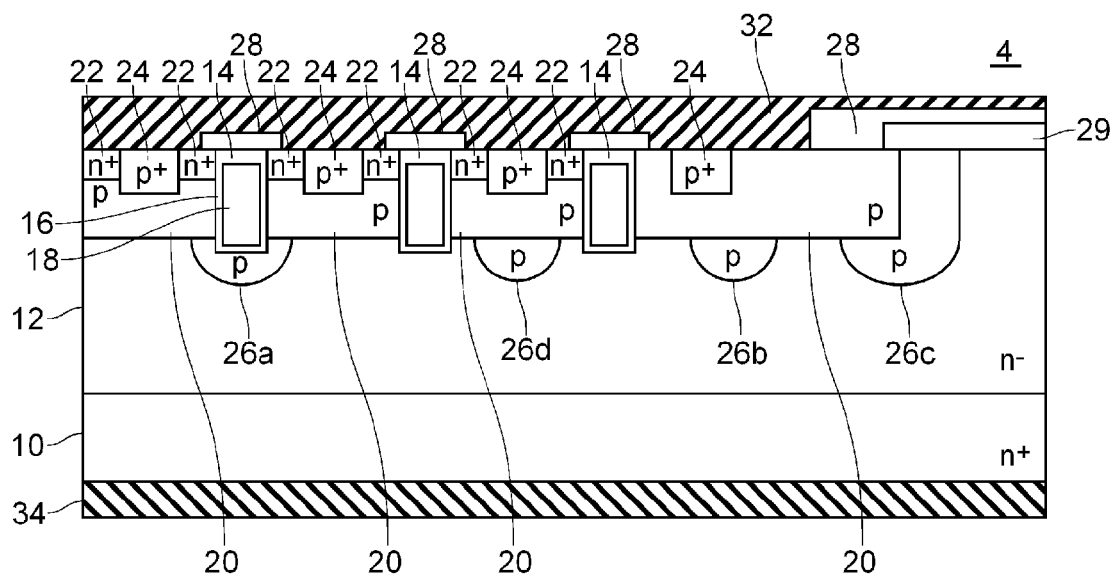

Next, for example, boron ions (for example, $2\times10^{14}$ cm$^{-2}$) are implanted in portions which are expected to become the p$^+$-type contact regions 24 and, thereafter, thermal annealing is performed (for example, at a temperature of 900° C. for 30 minutes) thus forming the p$^+$-type contact regions 24 (see FIG. 12(g)).

(h) Eighth Step

Next, for example, arsenic ions (for example, $4\times10^{15}$ cm$^{-2}$) are implanted to portions corresponding to the n$^+$-type source regions 22. Thereafter, thermal annealing is performed (for example, at a temperature of 1000° C. for 10 minutes) thus forming the n$^+$-type source regions 22 (see FIG. 12(h)).

(i) Ninth Step

Next, insulation layers 28 are formed over the trenches and, at the same time, undesired insulation layers are removed. Thereafter, a source electrode 32 is formed over the insulation layers 28. Further, a drain electrode 34 is formed over a back surface of the n$^+$-type silicon substrate 10 (see FIG. 12(i)).

According to the method of manufacturing a trench gate power MOSFET according to the embodiment 7, by performing the above-mentioned steps, the trench gate power MOSFET 4 according to the embodiment 4 can be manufactured. In this manner, according to the method of manufacturing the trench gate power MOSFET of the embodiment 7, it is possible to manufacture the trench gate power MOSFET 4 using the relatively simple method.

[Modification]

Figure 13B:
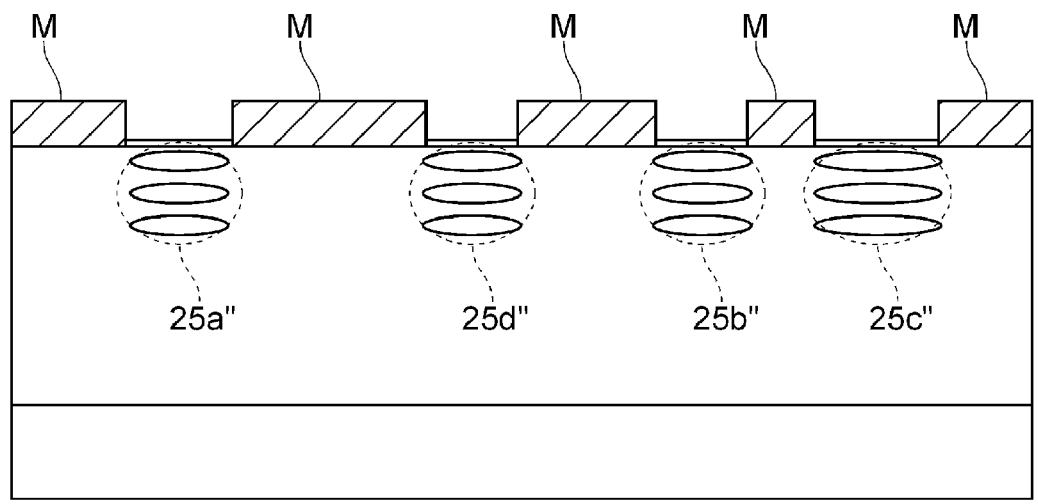
FIGS. 13B'-C' are views showing respective manufacturing steps of the manufacturing method of a trench gate power MOSFET according to a modification of the embodiment 7.
Figure 13C:
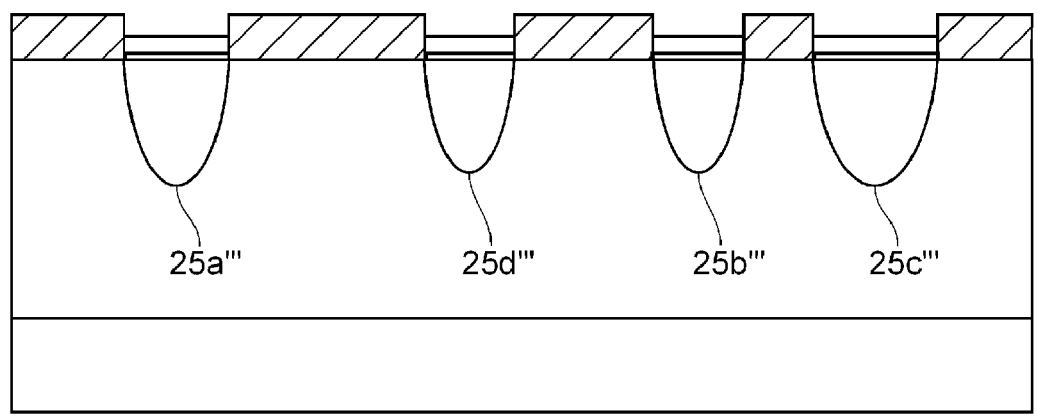

FIG. 13 is a view showing respective manufacturing steps of a method of manufacturing a trench gate power MOSFET according to a modification of the embodiment 7.

The method of manufacturing a trench gate power MOSFET according to the modification of the embodiment 7 is basically considerably similar to the method of manufacturing a trench gate power MOSFET according to the embodiment 7. However, the method of manufacturing a trench gate power MOSFET according to the modification of the embodiment 7 differs from the method of manufacturing a trench gate power MOSFET according to the embodiment 7 with respect to the second and third steps. That is, in the method of manufacturing a trench gate power MOSFET according to the modification of the embodiment 7, the second step and the third step are performed as follows.

(b') Second Step

A silicon oxide film M is selectively formed on a surface of the n$^-$-type epitaxial layer 12. Using the silicon oxide film M as a mask, for example, boron ions are implanted in multiple stages (for example, 50 keV to 2 MeV) thus forming boron-ion-implanted layers 25a'', 25d'', 25b'', 25c'' (see FIG. 13(b')).

(c') Third Step

Next, thermal annealing is performed (for example, at a temperature of 1000° C. for 10 minutes) thus forming the p-type diffusion layers 25a''', 25d''', 25b''', 25c''' which constitute the p-type carrier extracting regions (see FIG. 13(c')).

In this manner, according to the method of manufacturing a trench gate power MOSFET of the modification of the embodiment 7, by implanting the boron ions in multiple stages in second step, it is possible to form the p-type diffusion layers 25a''', 25d''', 25b''', 25c''' at a deep position due to thermal annealing performed in third step. Accordingly, the method of manufacturing a trench gate power MOSFET according to the modification of the embodiment 7 can acquire an advantageous effect that the p-type carrier extracting regions 26a, 26d, 26c, 26b deeper than the p-type body region 20 can be easily formed.

Embodiment 8

A manufacturing method of a trench gate power MOSFET according to an embodiment 8 is a manufacturing method of manufacturing a trench gate power MOSFET provided for manufacturing the above-mentioned trench gate power MOSFET 5 according to the embodiment 5.

FIG. 14 to FIG. 16 are views showing respective manufacturing steps of the method of manufacturing the trench gate power MOSFET according to the embodiment 8.

The method of manufacturing the trench gate power MOSFET according to the embodiment 8, as shown in FIG. 14 to FIG. 16, includes following steps consisting of (a) a first step to (i) a ninth step executed in this order.

(a) First Step

Figure 14A:
FIGS. 14A-C are views showing respective manufacturing steps of a manufacturing method of a trench gate power MOSFET according to an embodiment 8.
Figure 14B:
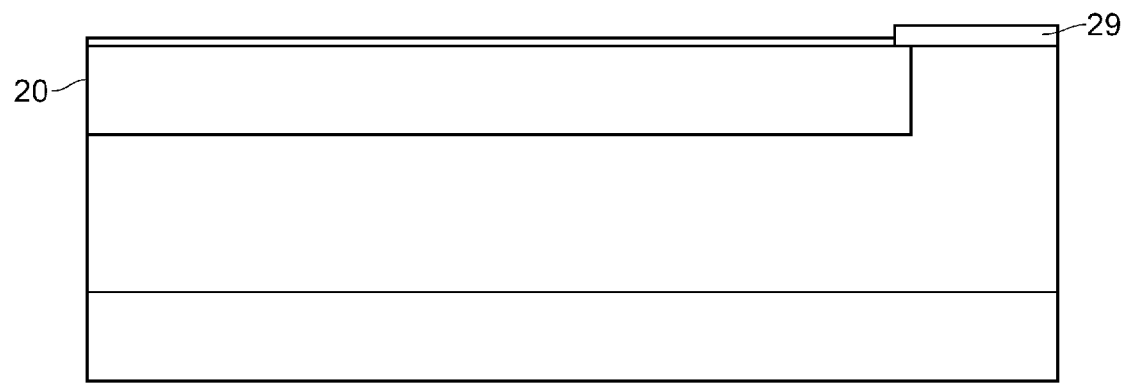
Figure 14C:
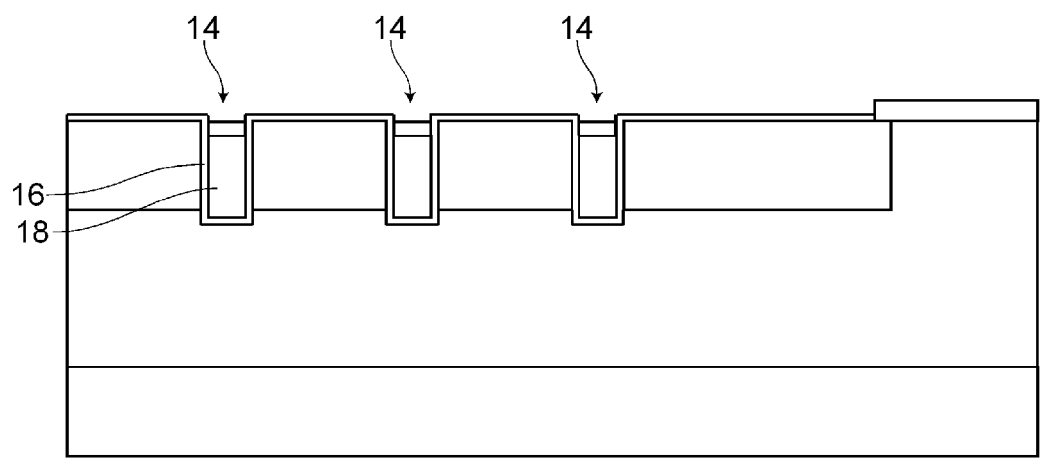

The n$^+$-type silicon substrate 10 which forms an n$^-$-type epitaxial layer 12 on an upper surface thereof is prepared (see FIG. 14(a)). The impurity concentration of the n$^-$-type epitaxial layer 12 is, for example, $3\times10^{+15}$ atoms/cm$^3$.

(b) Second Step

Next, an insulation layer 29 is selectively formed. Thereafter, using the insulation layer 29 as a mask, for example, boron ions (for example, $1.5\times10^{13}$ cm$^{-2}$) are implanted from a surface of an n$^-$-type epitaxial layer 12 and, thereafter, thermal annealing is performed (for example, at a temperature of 1100° C. for 45 minutes) thus forming the p-type body region 20 (see FIG. 14(b)).

(c) Third Step

Next, a silicon oxide film (not shown in the drawing) is selectively formed on the surface of the n⁻-type epitaxial layer 12 and the trenches 14 are formed using the silicon oxide film as a mask. After removing the silicon oxide film, gate insulation films 16 are formed on inner surfaces of the trenches 14 by thermal oxidation. Thereafter, the inside of the trenches is filled with polysilicon doped with phosphors, an upper surface of the polysilicon is etched back, and the upper surface is thermally oxidized to form gates 18 (see FIG. 14(c)).

(d) Fourth Step

Figure 15D:
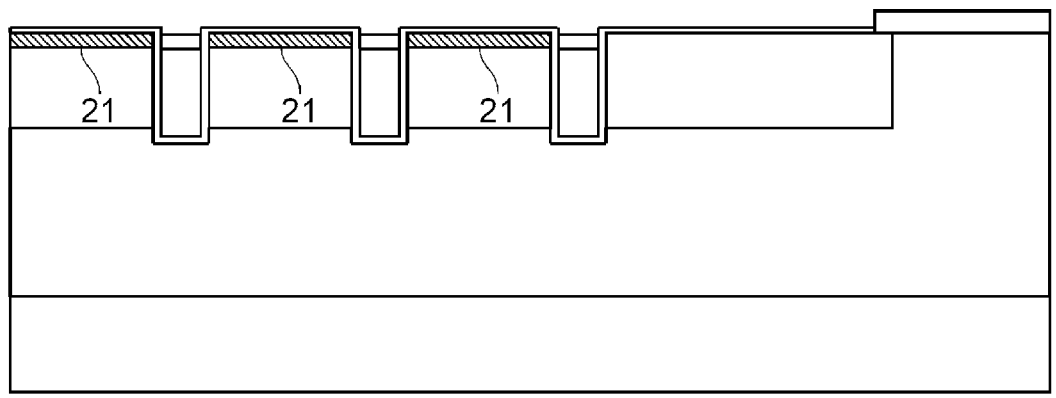
FIGS. 15D-F are views showing respective manufacturing steps of the manufacturing method of the trench gate power MOSFET according to the embodiment 8.

Next, for example, arsenic ions (for example, $4 \times 10^{15}$ cm$^{-2}$) are implanted to inter-trench regions respectively sandwiched between the trench 14 and the trench 14 thus forming arsenic ion implanted layers 21 (see FIG. 15(d)).

(e) Fifth Step

Figure 15E:
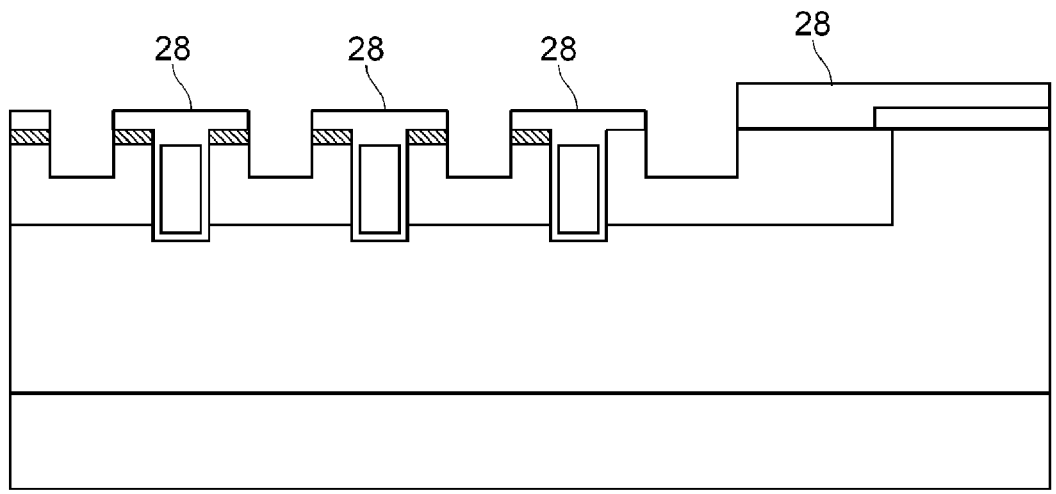

Next, insulation layers 28 are formed and, using the insulation layers 28 as a mask, the second trenches are formed at predetermined positions in an intermediate region and a peripheral region in the inter-trench regions respectively sandwiched by the trenches 14 (see FIG. 15(e)).

(f) Sixth Step

Figure 15F:
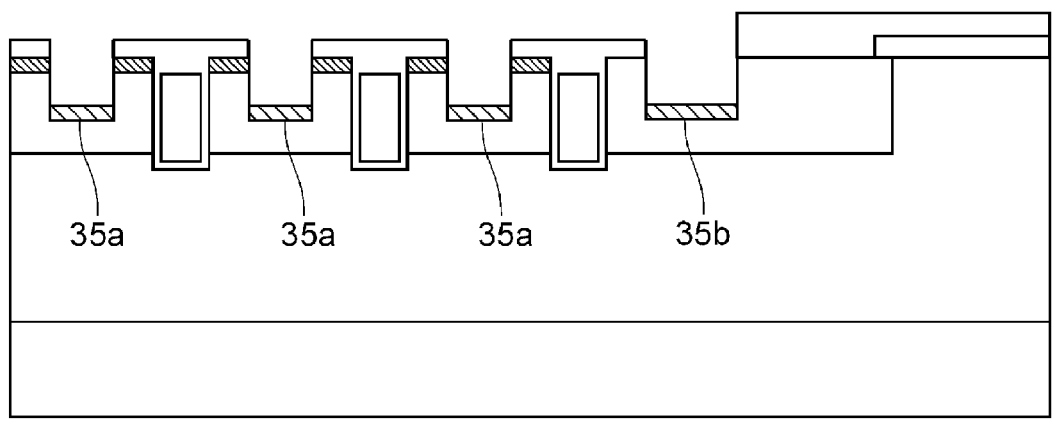

Next, for example, boron ions (for example, $2.6 \times 10^{15}$ cm$^{-2}$) are implanted to bottom portions of the second trenches thus forming boron-ion-implanted layers 35a, 35b (see FIG. 15(f)).

(g) Seventh Step

Figure 16G:
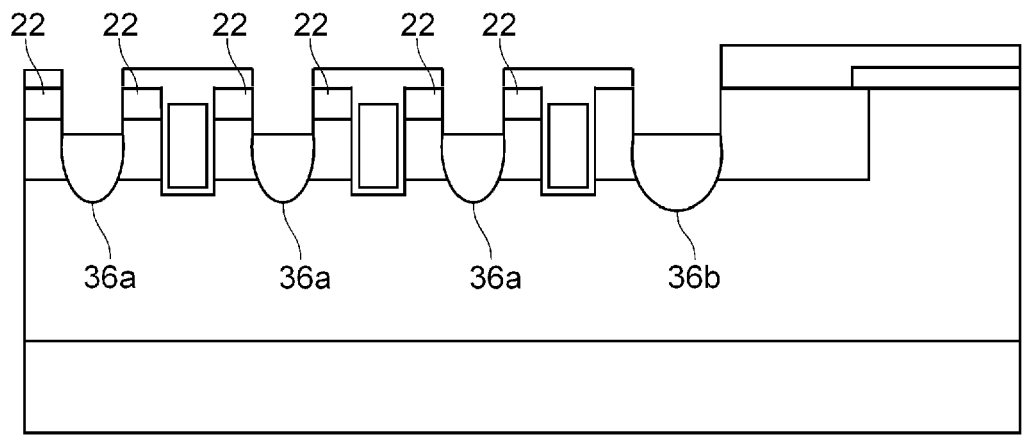
FIGS. 16G-I are views showing respective manufacturing steps of the manufacturing method of the trench gate power MOSFET according to the embodiment 8.

Next, thermal annealing is performed (for example, at a temperature of 1000° C. for 10 minutes) thus forming the n⁺-type source regions 22 and the p-type carrier extracting regions 36a, 36b (see FIG. 16(g)).

(h) Eighth Step

Figure 16H:
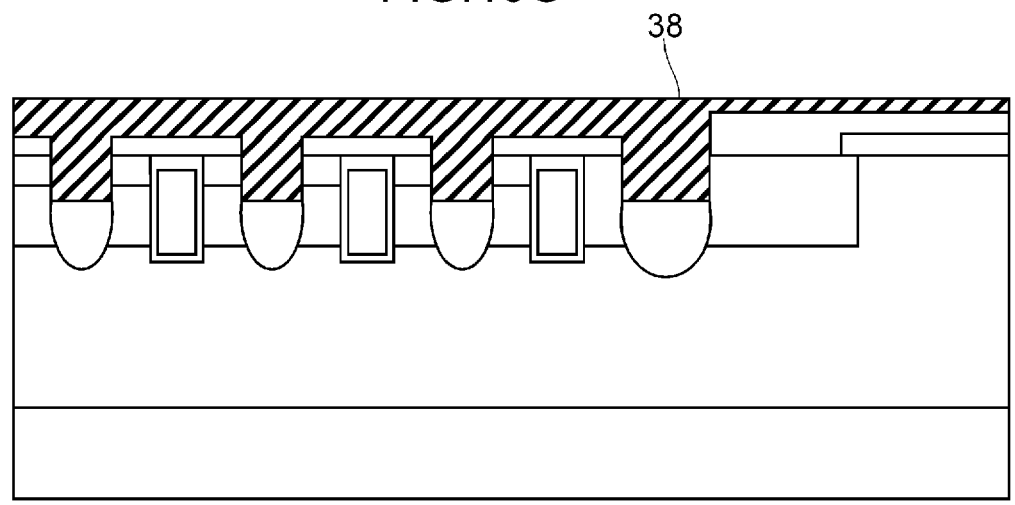

Next, a source electrode 38 is formed over the insulation layers 28 (see FIG. 16(h)). Here, the inside of the second trenches is filled with metal which constitutes the source electrode 38.

(i) Ninth Step

Figure 16I:
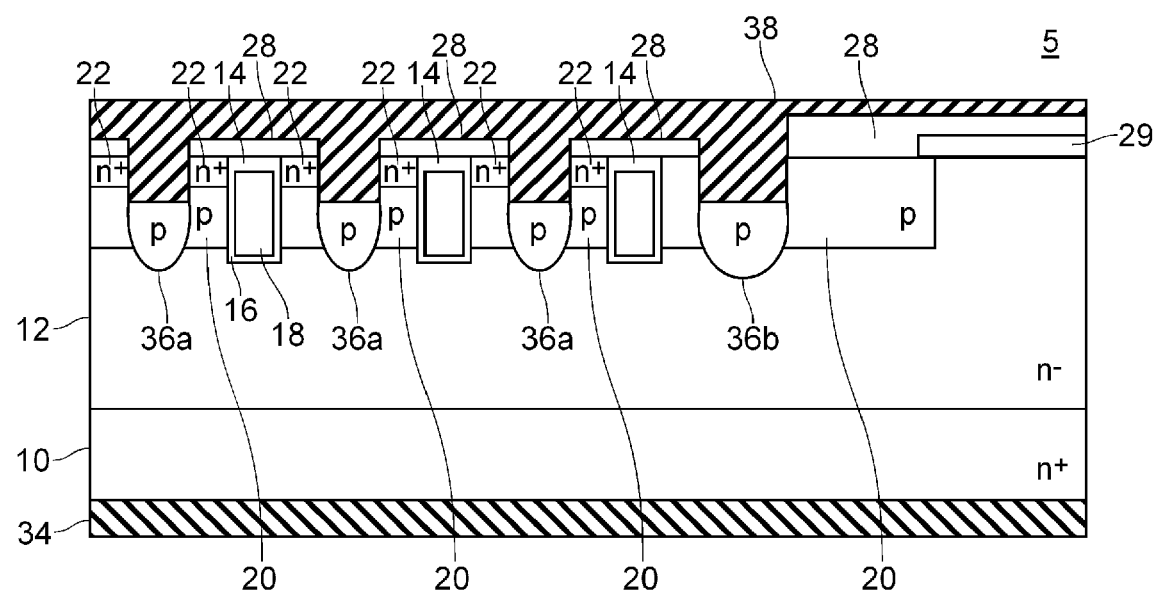
Figure 17:
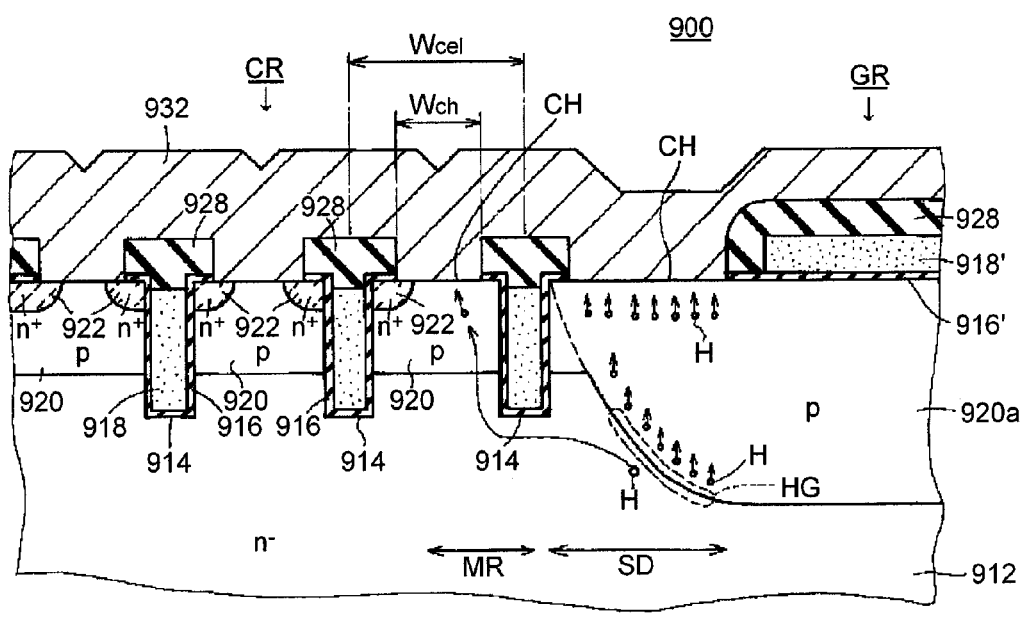
FIG. 17 is across-sectional view of a conventional trench gate power semiconductor device 900.

Next, a drain electrode 34 is formed on a back surface of an n⁺-type silicon substrate 10 (see FIG. 16(i)).

According to the method of manufacturing a trench gate power MOSFET according to the embodiment 8, by performing the above-mentioned steps, the trench gate power MOSFET 5 according to the embodiment 5 can be manufactured. In this manner, according to the method of manufacturing the trench gate power MOSFET of the embodiment 8, it is possible to manufacture the trench gate power MOSFET 5 using the relatively simple method.

Although the trench gate power semiconductor device of the present invention has been explained in conjunction with the above-mentioned respective embodiments, the present invention is not limited to the above-mentioned respective embodiments, and the present invention can be exercised in various modes without departing from the gist of the present invention and, for example, following modifications also fall within the scope of the present invention.

(1) In the above-mentioned embodiment 8, the method of manufacturing the trench gate power MOSFET 5 according to the embodiment 5 is explained. However, the present invention is not limited to such a manufacturing method and is also applicable to a method of manufacturing the trench gate power MOSFET 6 according to the embodiment 6 in the same manner.

(2) In the above-mentioned respective embodiments, the present invention is explained by taking the trench gate power MOSFET as an example. However, the present invention is not limited to the trench gate power MOSFET and is also applicable to a trench gate IGBT.

DESCRIPTION OF THE REFERENCE NUMERALS AND SIGNS 1, 2, 3, 4, 5, 6: trench gate power MOSFET, 10: n⁺-type silicon substrate, 12: n⁻-type epitaxial layer, 14: trench, 16: gate insulation film, 18: gate, 20: p-type body region, 22: n⁺-type source region, 24: p⁺-type contact region, 26a, 26b, 26c, 26d, 26e, 36a, 36b: p-type carrier extracting region, 28, 29: insulation layer, 30: thermal oxidization film, 32, 38: source electrode, 34: drain electrode, 900: trench gate power semiconductor device.

The invention claimed is:

1. A trench gate power semiconductor device comprising:
a semiconductor layer of first conductive type;
a body region of second conductive type opposite to the first conductive type, the body region formed in a vicinity of an upper surface of the semiconductor layer of first conductive type;
a plurality of first trenches formed so as to reach the semiconductor layer of first conductive type from an upper surface side of the body region of second conductive type; and
gates formed in the plurality of first trenches, wherein
a second trench of a depth smaller than a depth of the body region of second conductive type and including a metal layer connected with an electrode different from a gate electrode of electrodes formed on an upper surface of the semiconductor layer of first conductive type therein is formed in the body region of second conductive type, and
a carrier extracting region of second conductive type is formed on a lower surface of the second trench such that the carrier extracting region is connected to the metal layer and reaches the semiconductor layer of first conductive type.

2. A trench gate power semiconductor device according to claim 1, wherein the second trench is formed in all inter-trench regions which are respectively sandwiched between two neighboring first trenches of the plurality of first trenches.

3. A trench gate power semiconductor device according to claim 1, wherein the second trench is formed in a portion of regions of all inter-trench regions which are respectively sandwiched between two neighboring first trenches of the plurality of first trenches.

4. A trench gate power semiconductor device according to claim 1, wherein the second trench is formed in partial or whole regions of a portion of inter-trench regions of inter-trench regions which are respectively sandwiched between two neighboring first trenches of the plurality of first trenches.

5. A trench gate power semiconductor device according to claim 1, wherein the second trench is formed in a peripheral region further outside an outermost first trench of the plurality of first trenches.

6. A trench gate power semiconductor device according to claim 2, wherein the second trench is formed in a peripheral region outside an outermost first trench of the plurality of first trenches.

7. A trench gate power semiconductor device according to claim 6, wherein the second trench formed in the peripheral region has a width larger than a width of the second trench formed in the inter-trench region.

8. A trench gate power semiconductor device according to claim 6, wherein the carrier extracting region of second conductive type formed in the peripheral region is formed so as to reach a position deeper than the carrier extracting region of second conductive type formed in the inter-trench region.

9. A trench gate power semiconductor device according to claim 1, wherein the carrier extracting region of second conductive type is formed so as to reach a position of a depth larger than a depth of the plurality of first trenches.

10. A trench gate power semiconductor device according to claim 1, wherein on a portion of the carrier extracting region of second conductive type which is brought into contact with the second trench, a contact layer for reducing contact resistance with the metal layer filled in an inside of the second trench is formed.

11. A trench gate power semiconductor device according to claim 1, wherein the trench gate power semiconductor device is a power MOSFET.

12. A trench gate power semiconductor device according to claim 1, wherein the trench gate power semiconductor device is an IGBT.

* * * * *